United States Patent
Blednov (10) Patent No.: US 10,326,409 B2
(45) Date of Patent: Jun. 18, 2019

(54) INTER-STAGE NETWORK FOR RADIO FREQUENCY AMPLIFIER

(71) Applicant: NXP USA, Inc., Austin, TX (US)

(72) Inventor: Igor Blednov, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/840,895

(22) Filed: Dec. 13, 2017

(65) Prior Publication Data

US 2018/0175801 A1    Jun. 21, 2018

(30) Foreign Application Priority Data

Dec. 16, 2016 (EP) .................... 16306705

(51) Int. Cl.
 *H03F 3/68* (2006.01)
 *H03F 1/02* (2006.01)
 (Continued)

(52) U.S. Cl.
 CPC ........... *H03F 1/0288* (2013.01); *H01L 23/66* (2013.01); *H03F 1/565* (2013.01); *H03F 3/195* (2013.01); *H03F 3/211* (2013.01); *H03F 3/213* (2013.01); *H03F 3/60* (2013.01); *H03F 3/601* (2013.01); *H03F 3/604* (2013.01); *H01L 2223/6655* (2013.01); *H03F 2200/108* (2013.01); *H03F 2200/165* (2013.01); *H03F 2200/168* (2013.01);
 (Continued)

(58) Field of Classification Search
 CPC .......... H03F 1/0288; H03F 3/60; H03F 3/211; H03F 3/601; H03F 3/213; H03F 3/604; H03F 3/195; H03F 1/565; H01L 23/66
 USPC .............................. 330/302, 295, 124 R, 307
 See application file for complete search history.

(56) References Cited

U.S. PATENT DOCUMENTS

2005/0083117 A1* 4/2005 Kim .................. H03F 1/0211
                                                              330/51
2009/0174482 A1   7/2009 Blednov
                       (Continued)

OTHER PUBLICATIONS

Karthaus, U. et al., "Fully Integrated 39 dBm, 3-Stage Doherty PA MMIC in a Low-Voltage GaAs HBT Technology", IEEE Microwave and Wireless Components Letters, vol. 22, No. 2, pp. 94-96 (Feb. 2012).
Kang, D. et al., "Broadband HBT Doherty Power Amplifiers for Handset Applications", IEEE Transactions on Microwave Theory and Techniques, vol. 58, No. 12, pp. 4031-4039 (Dec. 2010).
(Continued)

*Primary Examiner* — Khanh V Nguyen
*Assistant Examiner* — Khiem D Nguyen (57) ABSTRACT

A device includes a substrate and a package input terminal. The device includes a driver amplifier mounted to the substrate and configured to receive a radio frequency input signal. A first amplifier is mounted to the substrate. The first amplifier includes a first amplifier input terminal. A second amplifier is mounted to the substrate. The second amplifier includes a second amplifier input terminal. An inter-stage network is connected between the driver amplifier and the first amplifier and between the driver amplifier and the second amplifier. The inter-stage network includes a first capacitor connected between the driver amplifier and the first amplifier input terminal, and an inductor having a first terminal and a second terminal. The first terminal of the inductor is connected to the first capacitor. The inter-stage network includes a second capacitor connected between the second terminal of the inductor and the second amplifier input terminal.

10 Claims, 7 Drawing Sheets

(51) Int. Cl.
  *H03F 1/56* (2006.01)
  *H03F 3/195* (2006.01)
  *H03F 3/21* (2006.01)
  *H03F 3/213* (2006.01)
  *H03F 3/60* (2006.01)
  *H01L 23/66* (2006.01)

(52) U.S. Cl.
  CPC .. *H03F 2200/171* (2013.01); *H03F 2200/222* (2013.01); *H03F 2200/225* (2013.01); *H03F 2200/297* (2013.01); *H03F 2200/301* (2013.01); *H03F 2200/318* (2013.01); *H03F 2200/387* (2013.01); *H03F 2200/391* (2013.01); *H03F 2200/411* (2013.01); *H03F 2200/42* (2013.01); *H03F 2200/432* (2013.01); *H03F 2200/451* (2013.01); *H03F 2200/48* (2013.01); *H03F 2200/54* (2013.01); *H03F 2200/75* (2013.01)

(56) References Cited

U.S. PATENT DOCUMENTS

| | | |
|---|---|---|
| 2015/0333706 A1 | 11/2015 | Blednov |
| 2016/0006399 A1 | 1/2016 | Blednov |
| 2016/0241209 A1 | 8/2016 | Lehtola |

OTHER PUBLICATIONS

Carneiro, M.L. et al., "Fully integrated CMOS doherty power amplifier with network matching optimization for die size reduction", Analog Integrated Circuits and Signal Processing, Springer New York LLC, US, vol. 82, No. I, pp. 89-97 (Nov. 26, 2014).

Kang, D et al., "1.6-2.1 GHz Broadband Doherty Power Amplifiers for LTE Handset Applications", IEEE MTT-S International Microwave Symposium, Baltimore, MD, pp. 1-4 (Jun. 2011).

Pengelly, Ray; "The Doherty Power Amplifier—1936 to the Present Day"; IEEE—IMS 2015; 25 pages (Jun. 2015).

* cited by examiner

INTER-STAGE NETWORK FOR RADIO FREQUENCY AMPLIFIER

FIELD OF USE

Embodiments of the subject matter described herein relate generally to radio frequency (RF) amplifiers, and more particularly to RF amplifiers that include power amplifiers implemented as RF integrated circuits (ICs) including integrated inter-stage networks.

DESCRIPTION OF THE RELATED ART

A radio frequency (RF) power amplifier (PA) is a device for receiving an input RF signal having an input power and generating an output RF signal that has an output power that is larger than the input power. The input RF signal can be, e.g., an input current and/or an input voltage. The output RF signal can be, e.g., an output current and/or an output voltage. An RF PA may also be referred to simply as an amplifier. The power ratio of the output RF signal with respect to the input RF signal is commonly referred to as the power gain. An ideal amplifier has a power gain that is independent of the power of the input RF signal.

Some RF amplifiers, such as Doherty amplifiers, utilize multiple separate power amplifiers on separate parallel paths to amplify an input RF signal. A Doherty amplifier, for example, typically includes a carrier path and a peaking path. Each path includes a different power amplifier configured to operate at different classes. More particularly, the carrier amplification path typically includes a power amplifier operating in a class AB mode and the peaking amplification path typically includes a power amplifier biased such that it operates in a class C mode. This enables improved power-added efficiency of the Doherty amplifier, as compared to a single end AB-class or balanced amplifier, at the power levels and power level variations commonly encountered in wireless communications applications.

Generally, a power splitter supplies the input signals to each amplification path in the Doherty amplifier. Power splitters or signal splitters or dividers are known and used, as the name suggests, to divide or split a signal into two or more signals with known, predetermined power relationships.

In a conventional Doherty amplifier, the power RFIC amplifiers of each path are implemented in packages that include, typically, a separate driver amplifier, final stage power transistor, and an inter-stage network to connect and match the output of the driver amplifier to the input of the final stage power transistor. Because the power amplifiers can be implemented as separate RFICs in separate or in single Push-Pull packages, each driver amplifier requires separate input matching and input biasing networks and separate inter-stage networks. These components can occupy a relatively large space within the packages, increasing the overall size of the amplifier device. Additionally, the inter-stage networks of conventional power RFIC amplifiers tend to be complex circuits that include many components, resulting in efficiency losses, particularly at operating frequencies above 2 GHz, which tend to be used for wireless communications, such as 5G wireless communications.

SUMMARY

According to a first aspect, there is provided a device, comprising: a driver amplifier having a driver output terminal; a main amplifier configured to amplify a main input signal, the main amplifier having a main input terminal; a peaking amplifier configured to amplify a peaking input signal, the peaking amplifier having a peaking input terminal; and an inter-stage network connected between the driver amplifier and the main amplifier and between the driver amplifier and the peaking amplifier, the inter-stage network including: a first capacitor having a first terminal and a second terminal, the first terminal of the first capacitor being connected directly to the driver output terminal and the second terminal of the first capacitor being connected directly to the main input terminal to supply the main input signal, an inductor having a first terminal and a second terminal, the first terminal of the inductor being connected directly to the first terminal of the first capacitor, and a second capacitor having a first terminal and a second terminal, the first terminal of the second capacitor being connected directly to the second terminal of the inductor and the second terminal of the second capacitor being connected directly to the peaking input terminal to supply the peaking input signal.

The device may include a resistor having a first terminal and a second terminal, wherein the first terminal of the resistor is connected directly to the first terminal of the second capacitor and the second terminal of the resistor is connected to a ground node. The resistor may be a variable resistor and changes to a resistance of the variable resistance modify a magnitude of the main input signal and a magnitude of the peaking input signal. The resistor may be coupled to an output pad of the peaking amplifier by a wirebond. A capacitance of the first capacitor may be determined by a ratio of an output radio frequency voltage magnitude of the driver amplifier and a peaking radio frequency input drive voltage of the main amplifier.

An output terminal of the main amplifier and an output terminal of the peaking amplifier may be connected to an output power combiner. The inductor may be a transmission line configured to introduce a 90 degree phase shift in a signal passing through the transmission line. The transmission line may be a coplanar waveguide transmission line. At least one of the driver amplifier and the peaking amplifier includes a transistor formed on a substrate selected from a silicon substrate, a gallium nitride substrate, a gallium arsenide substrate, and an indium gallium phosphide substrate.

According to a second aspect, there is provided a packaged device, comprising: a substrate; a package input terminal configured to receive a radio frequency input signal; a driver amplifier mounted to the substrate and configured to receive the radio frequency input signal; a first amplifier mounted to the substrate, the first amplifier including a first amplifier input terminal; a second amplifier mounted to the substrate, the second amplifier including a second amplifier input terminal; and an inter-stage network connected between the driver amplifier and the first amplifier and between the driver amplifier and the second amplifier, the inter-stage network including: a first capacitor connected between the driver amplifier and the first amplifier input terminal, an inductor having a first terminal and a second terminal, the first terminal of the inductor being connected to the first capacitor, and a second capacitor connected between the second terminal of the inductor and the second amplifier input terminal.

The packaged device may include a variable resistor connected between the second capacitor and a ground node, wherein changes to a resistance of the variable resistance modify a magnitude of an input signal to the first amplifier and a magnitude of a second input signal to the second amplifier. The variable resistor may be coupled by a wirebond to an output pad of one of the first amplifier and the second amplifier. A capacitance of the first capacitor may be determined by a ratio of an output radio frequency voltage magnitude of the first amplifier and a radio frequency input drive voltage of the first amplifier.

An output terminal of the first amplifier and an output terminal of the second amplifier may be connected to an output power combiner. The inductor may be a transmission line configured to introduce a 90 degree phase shift in a signal passing through the transmission line. The transmission line may be a coplanar waveguide transmission line.

According to a third aspect, there is provided a device, comprising: a first capacitor having a first terminal and a second terminal, the first terminal of the first capacitor being connected directly to a driver output terminal of a driver amplifier and the second terminal of the first capacitor being connected directly to a main input terminal to supply a main input signal to a main amplifier configured to amplify the main input signal; an inductor having a first terminal and a second terminal, the first terminal of the inductor being connected directly to the first terminal of the first capacitor; and a second capacitor having a first terminal and a second terminal, the first terminal of the second capacitor being connected directly to the second terminal of the inductor and the second terminal of the second capacitor being connected directly to a peaking input terminal to supply a peaking input signal to a peaking amplifier configured to amplify the peaking input signal.

The device may include a resistor having a first terminal and a second terminal, wherein the first terminal of the resistor is connected directly to the first terminal of the second capacitor and the second terminal of the resistor is connected to a ground node. A capacitance of the first capacitor may be determined by a ratio of an output radio frequency voltage magnitude of the driver amplifier and a peaking radio frequency input drive voltage of the main amplifier. The inductor may be a transmission line configured to introduce a 90 degree phase shift in a signal passing through the transmission line.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and details of well-known features and techniques may be omitted to avoid unnecessarily obscuring the invention. Elements in the figures are illustrated for simplicity and clarity and have not been necessarily drawn to scale. In fact, the dimensions of some of the elements or regions in the figures may be exaggerated relative to other elements or regions to better understand embodiments of the apparatus. The figures together with the detailed description are incorporated and form part of the specification and serve to further illustrate examples, embodiments and the like, and explain various principles and advantages, in accordance with the present disclosure, where.

DETAILED DESCRIPTION

The following detailed description is exemplary in nature and is not intended to limit the invention or the application and uses of the same. Furthermore, there is no intention to be bound by any expressed or implied theory presented in the preceding technical field, background, or the following detailed description.

The present embodiments may be used to improve the performance of and reduce the size of RFIC die and packaged power amplifier modules. The power amplifiers may be used in base station power amplifiers, cell phones, other portable devices, and other apparatus or devices dependent upon semiconductor packages, where low cost, low weight, and small volume may be desired.

Many amplifier devices, particularly those used to amplify radio frequency signals, rely upon multiple individual power amplifiers to amplify an input signal. These different power amplifiers, sometimes referred to as stages, may be configured to exhibit different operating characteristics enabling the multiple power amplifiers to enable the amplifier to work effectively over a range of input power levels and input frequencies.

A Doherty amplifier, for example, includes multiple amplification paths, each including a separate power amplifier to amplify input radio frequency signals. Specifically, a typical Doherty amplifier includes a main amplifier and a peaking amplifier, which are combined at an input and at an output by a respective input power splitter and a respective output power combiner. The peaking amplifier as well as the main amplifier may include one or more amplifier stages connected in parallel.

The input power splitter provides a first power fraction signal having a first predetermined power fraction of the input power to the main amplifier and a second power fraction signal having a second predetermined power fraction of the input power to the peaking amplifier, respectively. The first predetermined power fraction of the input power has typically a different magnitude (e.g., smaller) than the second predetermined power fraction intended for driving an amplifier of larger size that may be configured to operate as a C-class amplifier. Input power fraction signals of the main and peaking amplifiers may typically have a relative phase shift of 90 degrees positive or negative depending on Doherty configuration (e.g., classic or inverted).

When the input power to the Doherty amplifier is in a linear domain of the main amplifier, the peaking amplifier may be switched off (e.g. a bias current or voltage of the peaking amplifier may be reduced) to save energy and improve efficiency. The linear domain may be below an average power level of the Doherty amplifier input RF signal. The input RF signal may be modulated e.g. in frequency, amplitude or phase domain.

When the input power exceeds the linear domain of the main amplifier, however, the peaking amplifier may be switched on to assist the main amplifier in generating the output RF signal, while decreasing load at the main amplifier output until the load reaches an optimal value allowing maximal power level output. The Doherty amplifier therefore may have a linear power level that is larger than the main amplifier or the peaking amplifier output power level. The output of the main amplifier and the output of the peaking amplifier may be combined in a combining node to generate the output RF signal of the Doherty amplifier.

Typically, amplifiers of the Doherty type include multiple independent amplification paths, each with a separate power amplifiers (e.g., RFIC power amplifiers), where the power amplifiers may be arranged within separate semiconductor dies. The power amplifiers typically include a driver amplifier, a final power transistor, and an inter-stage network to connect and match the driver amplifier and final stage power transistor. Because the power amplifiers are typically implemented by separate RFIC dies or packages, the power amplifiers tend to occupy a relatively large space in the final Doherty amplifier device.

In the present disclosure, a new inter-stage network is presented in which the inter-stage network is configured to communicate the output of a single driver amplifier into the inputs of two or more final power amplifier devices, which may have a Doherty amplifier configuration. The inter-stage network may have a reduced number of components compared to conventional inter-stage networks and, consequently, can require less space to implement within a single semiconductor die and package as an integrated circuit. As such a single integrated circuit may be implemented that includes a single driver amplifier, the present inter-stage network and two or more power transistors for use within amplifying devices requiring multiple amplifier stages.

Furthermore, as described below, the present inter-stage network is tunable via an external component, enabling fine control over the amplitude and phase of the signals being fed into each of the final power transistors in the integrated circuit.

Figure 1:
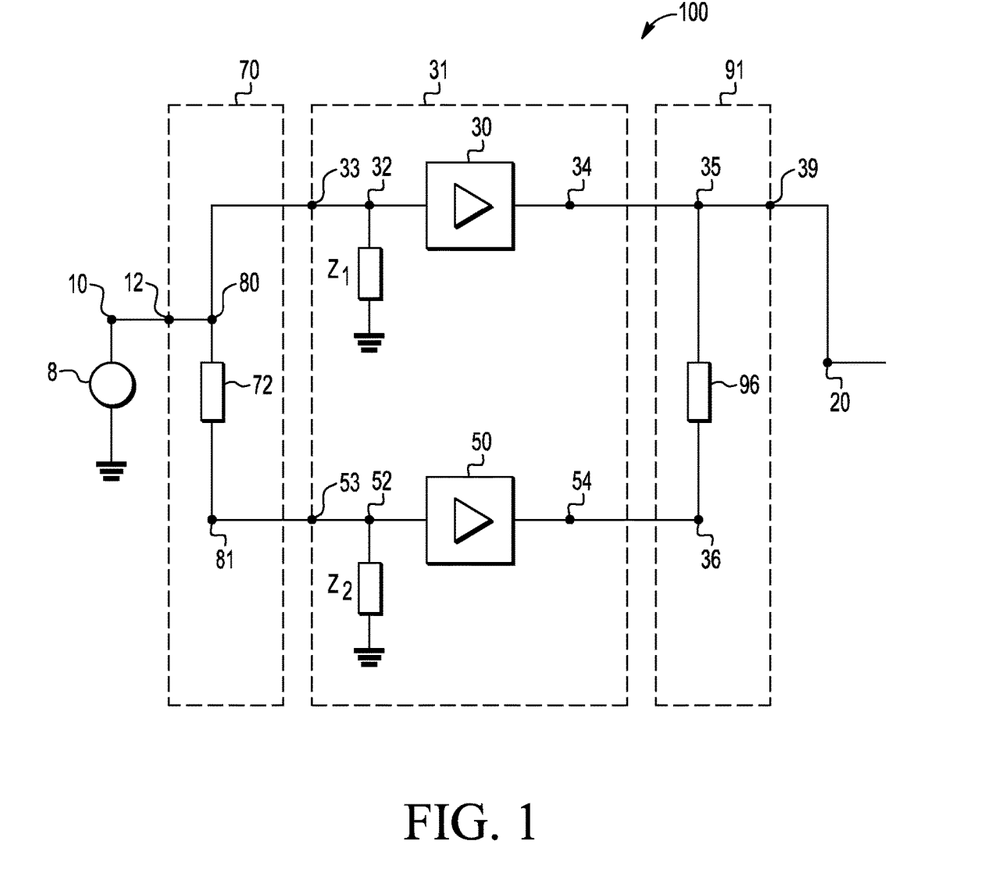
FIG. 1 depicts a conventional radio frequency power amplifier circuit, in which the amplifier circuit includes multiple amplification paths and corresponding power amplifiers.

FIG. 1 depicts a conventional radio frequency power amplifier circuit 100, in which the amplifier circuit 100 includes multiple amplification paths and corresponding power amplifiers. The RF power amplifier circuit 100 has an input terminal 10 for receiving an input RF signal and an output terminal 20 for outputting an output RF signal. The input RF signal may be generated by a power source 8. The input RF signal has an input power level which is amplified by the RF power amplifier circuit 100 to a higher output power level of the output RF signal. The power source 8 may be for example a suitable signal generator or a pre-driver amplifying stage suitable for the specific implementation.

The RF power amplifier circuit 100 further comprises two amplifier stages—a first amplifier stage 30 and a second amplifier stage 50. The first amplifier stage 30 has a first input 32 and a first output 34. The second amplifier stage 50 has a second input 52 and a second output 54. The driver stage of the first amplifier 30 may have a first internal input impedance Z1, and the driver stage of the second amplifier 50 may have a second internal input impedance Z2.

The respective inputs 32 and 52 of the amplifier stages 30 and 50 are normally electrically coupled to the input terminal 10 via an input power splitter 70. The first input 32 and the second input 52 are arranged to receive a respective power fraction signal having a respective power fraction of the input power. The input power splitter 70 provides to the respective inputs 32 and 52 the respective power fraction signals having the respective power fractions of the input power.

The respective outputs 34 and 54 output respective output RF signals, e.g. a first output RF signal and a second output RF signal, of the final stages of amplifier 30 and 50. The respective outputs 34 and 54 are electrically coupled to the output terminal 20.

For example, the first output 34 and the second output 54 may be electrically coupled to the output terminal 20 via an output power combiner 91 that combines the first output RF signal and the second output RF signal into the output RF signal at the output terminal 20. The output power combiner 91 may for example have, as shown in FIG. 1, node 35 connected to output 34 of the first amplifier 30 and input 36 connected to the output 54 of the second amplifier 50 as inputs of the output power combiner 91.

The output power combiner 91 may comprise an output transmission line 96 arranged between a first output node 35 and a second output node 36.

The input power splitter 70 comprises a splitter input terminal 12, an input transmission line 72 arranged between a first node 80 and a second node 81. The splitter input terminal 12 is electrically connected to the input terminal 10 for receiving the input RF signal from the input terminal 10. In the example of FIG. 1, the first node 80 is electrically coupled to the first input 32 and node 81 is electrically coupled to input 52.

The RF power amplifier circuit 100 may comprise an RFIC power amplifier component 31.

The first dual-stage RFIC amplifier 30 and the second dual-stage RFIC amplifier 50 together with the output power combiner 91 as a state of the art are normally arranged in the RF package as an amplifier component 31 where combiner 91 is normally located externally on a printed circuit board (PCB). Combiner 91 may, in some cases, be implemented within package 31, but such an approach requires significant space and high quality passive integrated device (IPD) components, which can limit the feasibility of such an approach. The RF power amplifier component 31 shown in FIG. 1 has a first input lead 33 and a second input lead 53, and is connected to output lead 39 to electrically connect the RF power amplifier circuit 100 to an external circuit. The external circuit may be implemented on a PCB in order to bring into operation the RF power amplifier circuit 100, thus connecting it to, e.g., the power source 8 and/or to a bias circuitry for biasing the amplifier stages 30 and, 50, etc. The first input 32 of the first amplifier 30 may be electrically coupled to the first input lead 33 and the second input 52 may be electrically coupled to the second input lead 53, respectively.

The input power splitter 70 is arranged outside the RF power amplifier component 31. The input power splitter 70 may for example be arranged in the PCB external to the RF power amplifier component 31.

The RF power amplifier circuit 100 may be arranged to operate e.g. as a Doherty amplifier or as, for example, a class AB amplifier. A Doherty amplifier is an amplifier that comprises a main amplifier and a peaking amplifier, which are combined at an input and at an output by a respective input power splitter and a respective output power combiner. The peaking amplifier RFIC as well as the main amplifier RFIC may include one or more amplifier stages.

Input power splitter 70 provides a first power fraction signal having a first predetermined power fraction of the input power to the main amplifier (e.g., amplifier 30) and a second power fraction signal having a second predetermined power fraction of the input power to the peaking amplifier (e.g., amplifier 50), respectively. The first predetermined power fraction of the input power has typically a different magnitude than the second predetermined power fraction. Input power fraction signals of the main and peaking amplifiers may typically have a relative phase shift of 90 degrees. The output power combiner 91 typically allows to control a load of the main amplifier 30 by using the second predetermined power fraction. When the input power is in a linear domain of the main amplifier 30, the peaking amplifier 50 may be switched off (e.g. a bias current or voltage of the peaking amplifier may be reduced) to save energy and improve efficiency.

When implementing power amplifier circuit 100, amplifier stages 30 and 50 generally contain at least a driver amplifier and a final power transistor, with an inter-stage network connecting the driver amplifier to the final power transistor. Those three components (the driver amplifier, power transistor, and inter-stage network) are normally implemented within a single semiconductor die and, as such, both amplifier stage 30 and amplifier stage 50 will generally be implemented in separate packages or RF integrated circuits (RFICs).

Figure 2A:
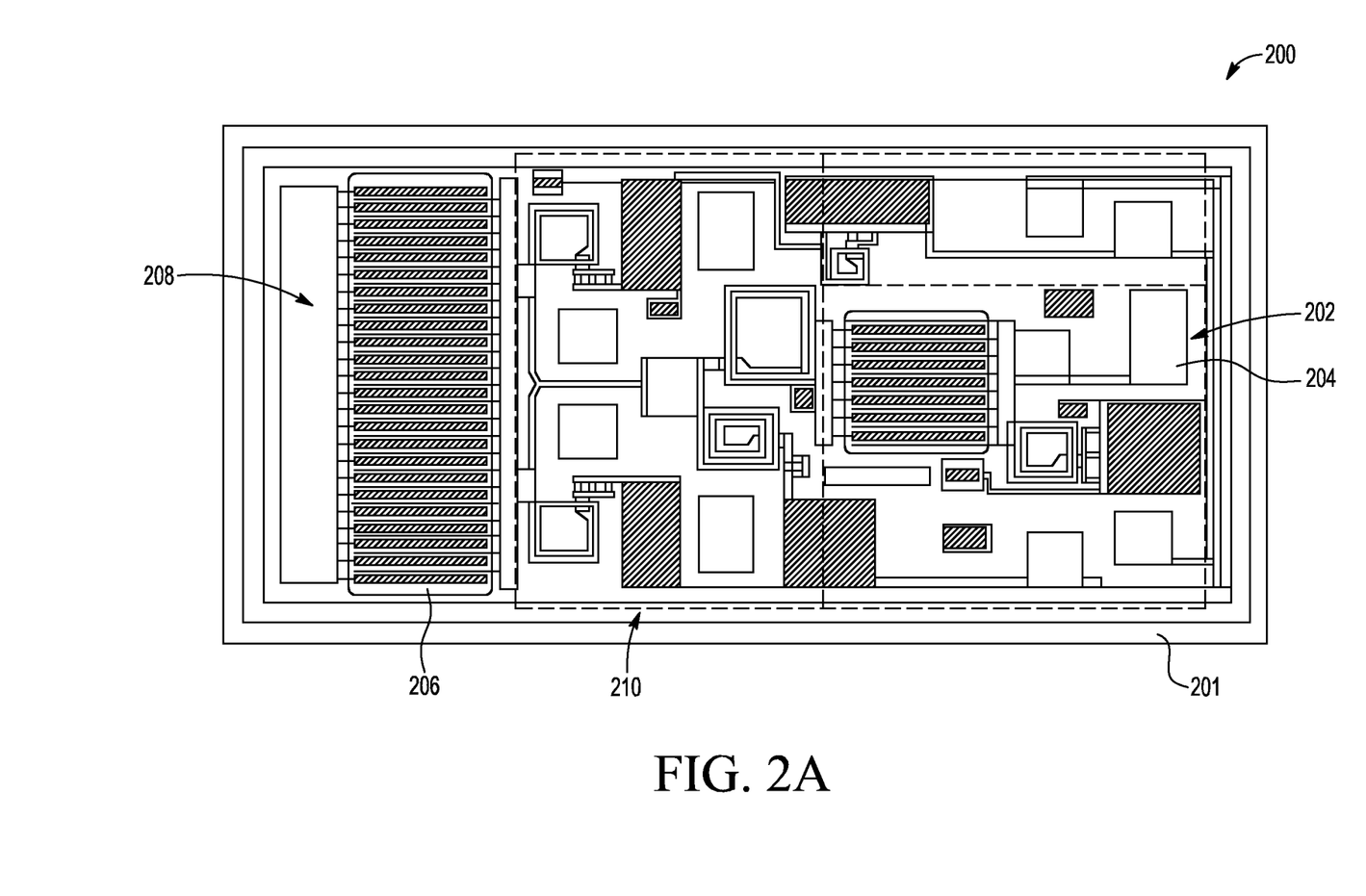
FIG. 2A illustrates a top view of an RFIC die implementing a 2 stage power amplifier.
Figure 2B:
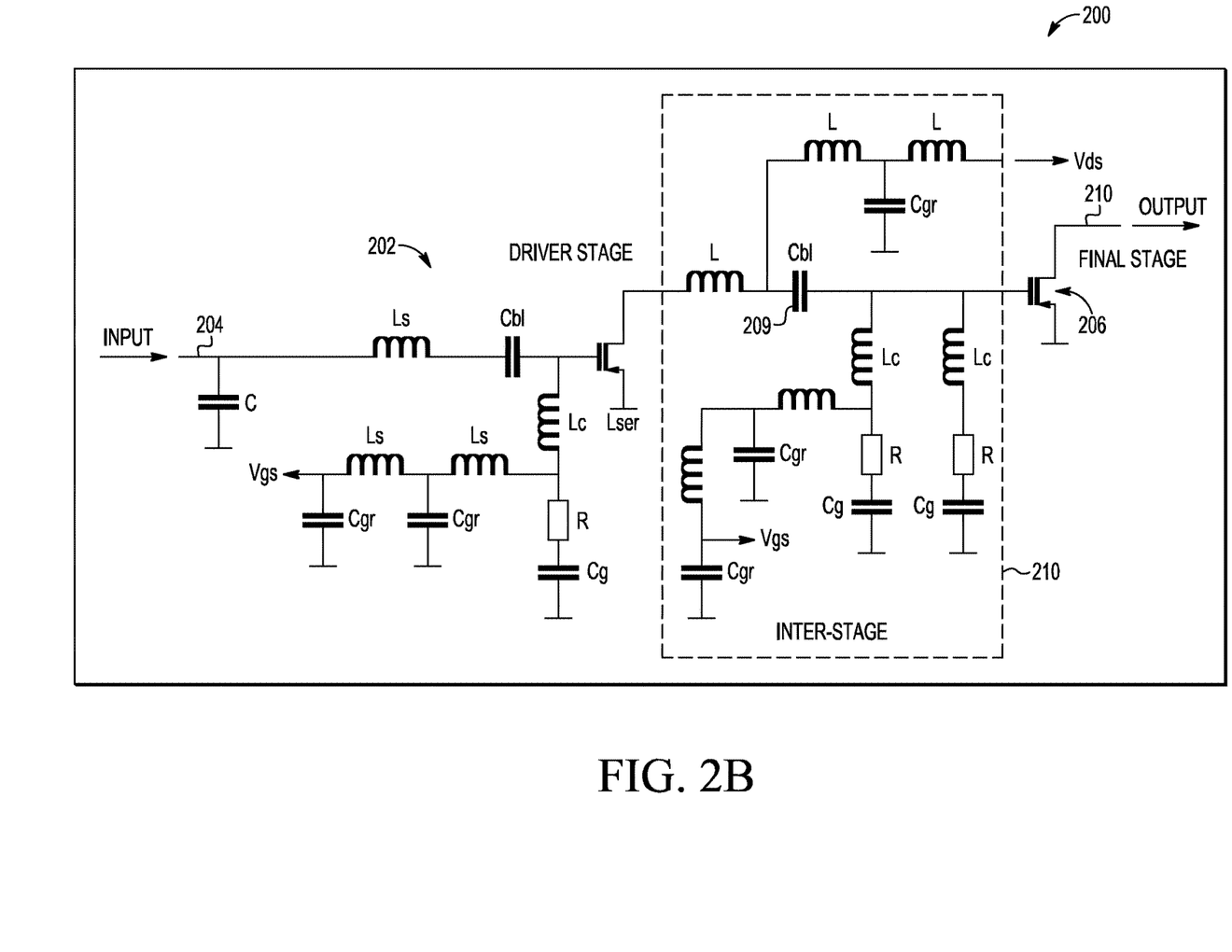
FIG. 2B is a schematic depicting an equivalent schematic of the power amplifier of FIG. 2A.

FIG. 2A illustrates a top view of a conventional RFIC amplifier die implementing a power amplifier 200. FIG. 2B is a schematic depicting an equivalent circuit for power amplifier 200 of FIG. 2A. In FIGS. 2A and 2B components sharing the same element numbers are generally the same components, which FIG. 2A illustrating the element as part of a semiconductor die, and FIG. 2B depicting an equivalent circuit for the component.

Power amplifier 200 may be configured in a substantially similar manner to an amplifier stage 30 or 50 from FIG. 1, for example. Generally, power amplifier 200 includes a driver amplifier 202 having an input contact pad 204 for receiving an input RF signal. Driver amplifier 202 is mounted to substrate 201, which may any suitable substrate material for power amplifier 200, including silicon (Si), GaAs, SiGe, GaN or any other kind of suitable semiconductors.

Driver amplifier 202 is generally configured to receive the RF input signal and, based upon that input signal, generate an output signal with an increased current configured to drive power transistor 206. Driver amplifier 202 is generally configured as an AB-class amplification stage, with a peak power level that may be in the range of 6 to 12 dB larger than the maximal power input to the power transistor 206.

Here, power transistor 206 is the primary active component of power amplifier 200. Power transistor 206 includes a control terminal and first and second current conducting terminals, where the current conducting terminals are spatially and electrically separated by a variable-conductivity channel. The second current conducting terminal is an output pad 208 of power transistor 206. The RF signal amplified by power transistor 206 is outputted at output pad 208.

Inter-stage network 210 connects the output of driver amplifier 202 to an input of final stage power transistor 206. Inter-stage network 210 is generally configured as a one- or two-step distributed and/or lumped element impedance transformation network, having a generally Low-Pass prototype configuration. Such an inter-stage network may be configured to provide for compensation of input capacitances of the driver amplifier output and the input of the final stage amplifier. The inter-stage network may also provide wideband impedance transformer matching of the output of the driver amplifier stage to the input of the final stage amplifier.

Within inter-stage network 210, a series RLC circuit may operate as a "cold point", free of RF signal allowing safe connection of a gate bias DC voltage for control of final stage device operation mode between C-class and AB-class. C-class operation mode can be used for a peak amplifier RFIC, while AB-class operation mode may be used for a main amplifier RFIC. The other LC components in the conventional inter-stage network 210 (normally 8 of them) are used as Low-Pass filters for the application of a drain supply voltage to the driver amplifier stage 202 and the gate bias for the final stage amplifier transistor 206. A series DC blocking capacitor 209 of the inter-stage network 210 can provide separation of driver drain (at a supply voltage of 28V for LDMOS implementations) from the gate of the final stage amplifier (at a relatively low DC voltage of 2-3 V at the gate terminal). Such a capacitor may require a relatively high capacitance, causing the capacitor to occupy a relatively large area in the RFIC. In some cases, to improve isolation of the RF path from the supply network and lower losses of RF signal within the inter-stage network, the drain voltage supply network is connected to the inter-stage impedance transformer at the point with lower impedance, which also requires a large blocking capacitor value with larger size. As a result, conventional inter-stage networks 210 normally occupy a major portion of space of RFIC die, which may occupy, in some cases, between 35 and 60% of the entire die area.

For example, as depicted in FIG. 2A it is apparent that inter-stage network 210 occupies a large amount of space within the package of power amplifier 200. In some conventional packages, for example, inter-stage network 210 may occupy up to 60% of the die area. Additionally, conventional inter-stage networks can cause significant power losses of RF signals, particularly for RF signals having frequencies exceeding 2 GHz and particularly on Si substrate used for LDMOS technology. This can, in turn, reduce the overall efficiency of power amplifier 200, as well as the overall efficiency of any devices utilizing power amplifier 200.

To mitigate these difficulties, the present disclosure provides a modified inter-stage network for use within a power amplifier RFIC. The inter-stage network may include fewer components and may operate at a higher RF impedance than a conventional inter-stage network (see, for example, FIG. 2B), meaning that the present inter-stage network allowing smaller RF currents and reduces RF losses. Furthermore, the present inter-stage network may be implemented within a smaller area of an integrated circuit or package.

The present inter-stage network is configured to couple a single driver amplifier to two or more power transistors, enabling a single integrated circuit to be utilized to provide a two stage high gain amplifier with only a single driver amplifier and a single wideband and, as compared to conventional inter-stage networks, compact inter-stage network. The inter-stage network can operate as a tunable input splitter for implementations where the amplifiers are configured as a final stage having a Doherty architecture. The total reduction in size of such an approach may be a reduction of up to 3 times in required RFIC die size.

Figure 3A:
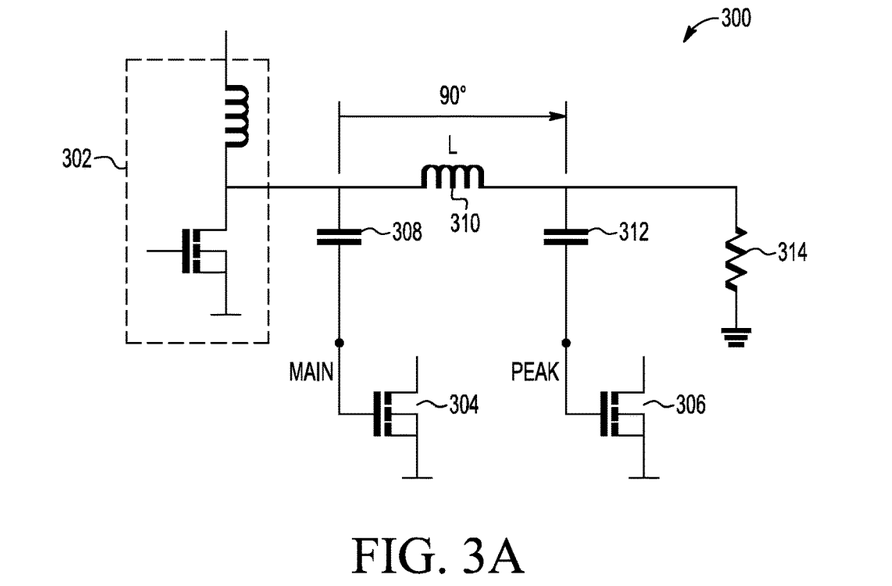
FIG. 3A is a schematic depicting a driver amplifier and Doherty final stage with two parallel transistor inputs connected by the present inter-stage network, which provides impedance transformation and tunable power inputs to each final stage transistor.
Figure 3B:
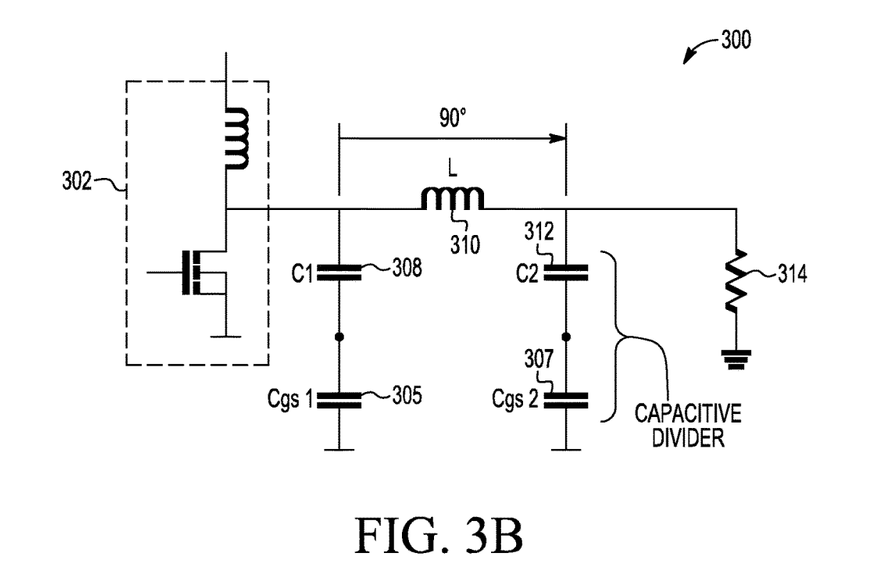
FIG. 3B depicts an equivalent circuit to that shown in FIG. 3A at typical amplifier operating frequencies.

FIG. 3A is a schematic depicting the present inter-stage network 300. FIG. 3B depicts an equivalent circuit to that shown in FIG. 3A at typical amplifier operating frequencies. As illustrated in FIG. 3A, a driver amplifier 302 is connected to inter-stage network 300. Driver amplifier 302 is connected to a first terminal of capacitor 308 and inductor 310. Inductor 310 may be implemented as a transmission line or any other circuit component that exhibits inductance. If implemented as a transmission line, inductor 310 may be configured as a coplanar waveguide, or inductor 310 may be implemented as one or more conductors formed over a surface of a substrate. Inductor 310 may be further configured to introduce a 90 degree phase shift in a signal passing through the transmission line.

Series capacitor 308 is connected, in turn, to a control terminal of transistor 304, which may be a first power transistor of the power amplifier. When amplifying RF signals at the power amplifier's operating frequencies (e.g., greater than 2 GHz), transistor 304 may resemble a capacitor to those RF signals and, as such, in the equivalent circuit of FIG. 3B, transistor 304 is replaced with capacitor 305. Capacitor 305 has a capacitance equal to the gate-to-source capacitance of transistor 304.

Inductor 310 is also connected to series capacitor 312 which is, in turn, connected to a control terminal of transistor 306. Transistor 306 may be a second power transistor of the power amplifier. When amplifying RF signals at the power amplifier's operating frequencies (e.g., greater than 2 GHz), transistor 306 may resemble a capacitor to those RF signals and, as such, in the equivalent circuit of FIG. 3B, transistor 306 is replaced with capacitor 307.

With reference to FIG. 3B, during operation of the power amplifier, the combination of capacitor 308 and equivalent capacitor 305 of FIG. 3B become a wideband capacitive voltage divider, which scales down the RF output voltage of driver amplifier 302 to a pre-determined voltage magnitude without the need of a large-size impedance transformation network, which is found in the conventional inter-stage network found in FIG. 2B as following:

The relationship between the capacitance values of capacitors 308 and 305 may be expressed in an inversely proportional relationship proportional to the required voltage division or scale down. For example, if an output RF voltage magnitude of driver amplifier 302 is 25 volts and the peaking RF input drive voltage magnitude of the input signal to transistor 304 is 5V, then the required capacitance of capacitor 308 (Cser) may be approximately K_Main times smaller than the gate-to-source capacitance (Cgs) of transistor 304 (represented by capacitor 305 of FIG. 3B).

$$C_{ser} = \frac{C_{gs}}{K_{Main}}$$

In which K_main is determined by the following equation in which $V_{RF\_out\_max}$ is the maximum RF output voltage of the main amplifier (i.e., transistor 304) and $V_{Gs\_max\_AB}$ is the maximum gate-to-source voltage of the main amplifier, $V_{DS}$ is the drain-to-source voltage of the main amplifier, $I_{d\_max}$ is the maximum drain current of the main amplifier and $g_{m\_max}$ is the transconductance of the main amplifier.

In such an application, the total input capacitance Cin and input impedance Zin of the overall amplifier device (while maintaining the requirement that the characteristic impedance of the inter-stage network be equal to the input impedance of the amplifier Zin) are determined by the following equations in which $C_{ser}$ is the capacitance of the series capacitor 308, $C_{gs}$ is the gate-to-source capacitance of transistor 304, and f0 is the center bandwidth frequency of the amplifier device.

$$C_{In} = \frac{C_{ser}C_{gs}}{C_{ser} + C_{gs}}$$

$$Z_0 = \frac{1}{2\pi f_0 C_{In}}$$

The inductance of inductor 310 can be equal to:

$$L = \frac{Z_0}{2\pi f_0}$$

In a similar manner to capacitors 308 and 305, during operation of the power amplifier, the combination of capacitor 312 and equivalent capacitor 307 of FIG. 3B becomes a wideband capacitive voltage divider, which scales down the RF output voltage of driver amplifier 302 to a pre-determined input voltage magnitude without the need of a large-size impedance transformation network, which is found in the conventional inter-stage network found in FIG. 2B.

The relationship between the capacitance values of capacitors 312 and 307 may be expressed in an inversely proportional relationship proportional to the required voltage division or scale down in a similar manner to that discussed above with respect to capacitors 308 and 305. For example, if an output RF voltage magnitude of driver amplifier 302 is 25 volts and the peaking RF input drive voltage magnitude of the input signal to transistor 306 is 5V, then the required capacitance of capacitor 312 may be approximately five times smaller than the gate-to-source capacitance of transistor 306 (represented by capacitor 307 of FIG. 3B).

When inter-stage network 300 is implemented in a typical power amplifier, where transistors 304 and 306 may represent the main and peaking amplifiers or a Doherty amplifier, for example, it may be desirable to take into account a desired asymmetry of a typical main and peaking amplifier—usually the peaking amplifier is a larger amplifier (e.g., transistor) and requires a larger required drive voltage for operation as a C-class amplifier. In such a case, the actual capacitance value of capacitor 312 will generally be different (e.g., larger) than the capacitance value of capacitor 308, to compensate for lower DC gate bias of Peak device according to the following expression in which Pin_peak is the input power to the peaking amplifier, Pin_main is the input power of the main amplifier, Vg_max represents the gate-source DC voltage, Vbias_peak is the bias voltage of the peaking amplifier, Vbias_main is the bias voltage of the main amplifier, Zin_main is the input impedance of the main amplifier, and Zin_peak is the input impedance of the peaking amplifier.

$$K_{Main} = \frac{V_{RF\_out\_max}}{1.8 V_{GS\_max\_AB}} = \frac{(2V_{DS} - V_{knee})g_{m\_max}}{2I_{d\_max}} = \frac{0.5\,S*52\,V}{2\,A} = 11$$

$$\frac{P_{In\_Peak}}{P_{In\_main}} = \frac{(V_{g\_max} - V_{bias\_Peak})^2 \text{Re}(Z_{In\_Main})}{(V_{g\_max} - V_{bias\_Main})^2 \text{Re}(Z_{In\_Peak})}$$

As illustrated in FIGS. 3A and 3B, a termination resistance 314 may be incorporated into inter-stage network 300. Resistor 314 is connected to inductor 310 and may operate to both prevent reflection of RF signal passing through inter-stage network 300 and also to provide for fine adjustment of RF drive amplitudes at the inputs of transistor 304 (e.g., a main amplifier) and transistor 306 (e.g., a peaking amplifier).

If the present inter-stage network 300 is considered to be a transmission line of kl=90 degree long, the input impedance (Zin), RF voltage amplitude, load (ZL), and RF voltage across inter-stage network 300 may be related in accordance with expression as following:

$$Z_{in} = Z_0 \frac{Z_L - jZ_0 \tan kl}{Z_0 - jZ_L \tan kl}$$

This expression suggests that the values of Zin, the RF voltage across inter-stage network 300 Vin, and the drive voltage at the input Cgs of transistor 304 (represented by capacitor 305) will depend on value of ZL which is a parallel combination of the input impedance (Zin) of peak transistor 306 (having equivalent capacitance 307) and resistor 314. By changing the value of resistor 314, Zin and the voltage across main transistor 304 device Cgs may be modified accordingly but in opposite directions, where RF input signal voltage across Cgs_p (capacitor 307) of peaking transistor 306 may become larger than that at Cgs_m (capacitor 305) of main transistor 304, which will compensate for peak transistor's 306 lower gain operating in C-class mode.

Figure 4:
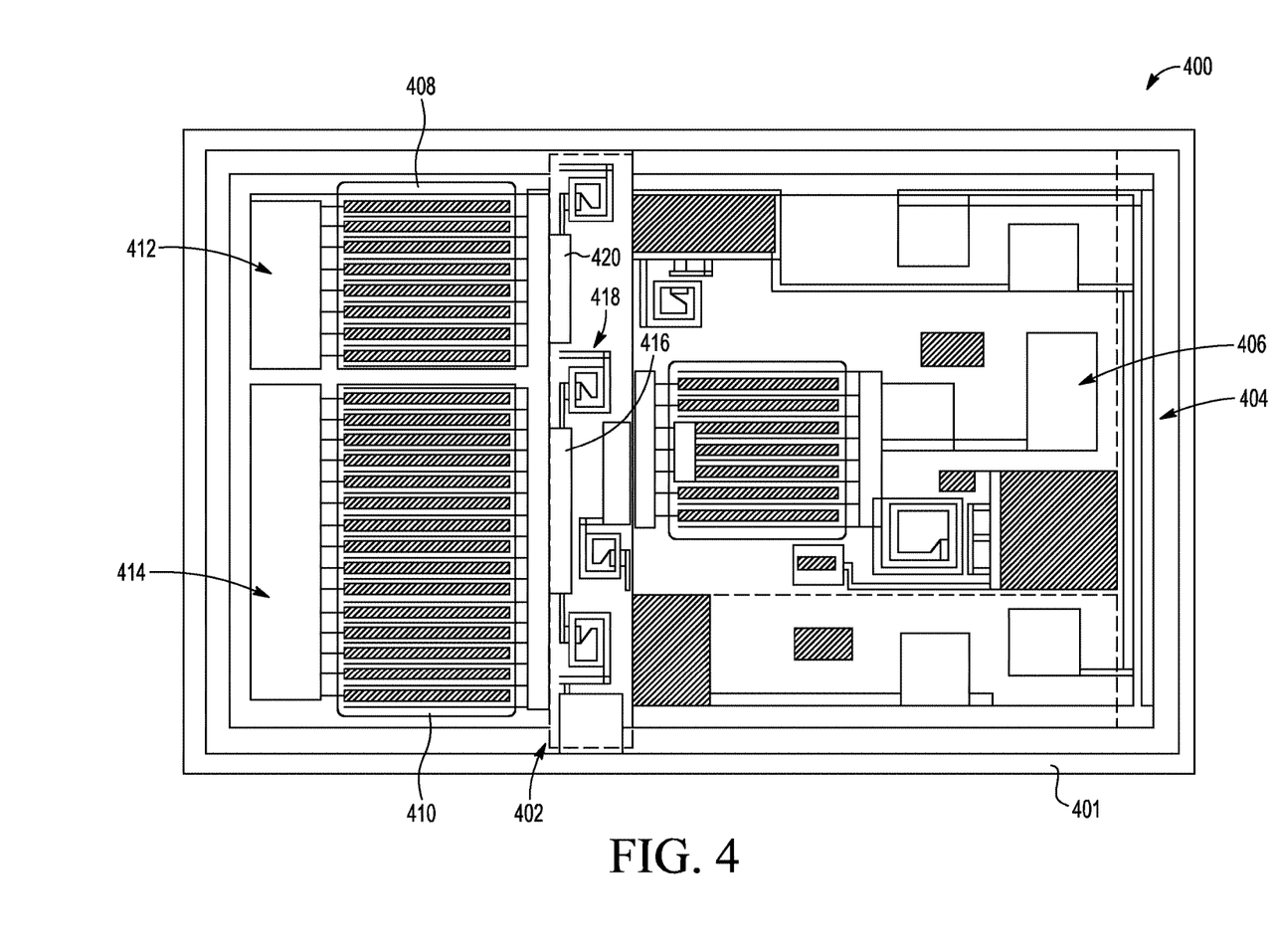
FIG. 4 illustrates a top view of the semiconductor die of an integrated circuit implementing a power amplifier incorporating an inter-stage network that may be configured in according to the schematic of FIGS. 3A and 3B.

FIG. 4 illustrates a top view of an integrated circuit implementing a power amplifier 400 incorporating an inter-stage network 402 configured in accordance with the schematic of FIGS. 3A and 3B. As depicted in FIG. 4, power amplifier 400 is implemented in an inverted Doherty arrangement where the output of driver amplifier 404 is connected first to the input of transistor 410, which may operate as the amplifier's peaking device, and then to the input of transistor 408, which may operate as the amplifier's main device, with corresponding phase shift.

Power amplifier 400 includes a driver amplifier 404 having an input contact pad 406 for receiving an input RF signal. Driver amplifier 404 is mounted to substrate 401, which may include any suitable substrate for power amplifier 400, including silicon (Si), GaAs, SiGe, GaN or any other kind of suitable semiconductors.

Driver amplifier 404 is generally configured to receive an RF input signal and, based upon that input signal, generate an output signal with an increased current configured to drive power transistors. Driver amplifier 404 is generally configured as an AB-class amplification stage, with a peak power level that may be in the range of 6 to 12 dB larger than the combined maximal power input to power transistors 408 and 410.

Although transistors 408 and 410 are generally shown as a singular components in FIG. 4, the depiction is for the purpose of ease of explanation only. Those of skill in the art would understand, based on the description herein, that power transistors 408 and 410 may be implemented as multiple components (e.g., connected in parallel or in series with each other). The description of power transistors 408 and 410, herein, are not intended to limit the scope of the inventive subject matter only to the illustrated embodiments.

Here, power transistor 408 is a first active component of power amplifier 400. If power device 400 were to be incorporated into a Doherty amplifier, for example, power transistor 408 may be equivalent to that amplifier's main amplifier. Power transistor 408 includes a control terminal and first and second current conducting terminals, where the current conducting terminals are spatially and electrically separated by a variable-conductivity channel. The second current conducting terminal is an output pad 412 of power transistor 408. The RF signal amplified by power transistor 408 is outputted at output pad 412.

Power transistor 408 may be a FET (such as a MOSFET, an LDMOS FET, an HEMT, and so on), which includes a gate (control terminal), a source (a first current conducting terminal), and a drain (a second current conducting terminal). Alternatively, power transistor 408 may be a BJT. Accordingly, references herein to a "gate," "drain," and "source," are not intended to be limiting, as each of these designations has analogous features for a BJT implementation (e.g., a base, collector, and emitter, respectively). Power transistor 408 may be formed on a substrate selected from a silicon substrate, a gallium nitride substrate, a gallium arsenide substrate, and an indium gallium phosphide substrate.

Power transistor 410 is a second active component of power amplifier 400. In power device 400 were to be incorporated into a Doherty amplifier, for example, power transistor 410 may be equivalent to that amplifier's peaking amplifier. Power transistor 410 includes a control terminal and first and second current conducting terminals, where the current conducting terminals are spatially and electrically separated by a variable-conductivity channel. The second current conducting terminal is an output pad 414 of power transistor 410. The RF signal amplified by power transistor 410 is outputted at output pad 414.

Power transistor 410 may be a FET (such as a MOSFET, an LDMOS FET, an HEMT, and so on), which includes a gate (control terminal), a source (a first current conducting terminal), and a drain (a second current conducting terminal). Alternatively, power transistor 410 may be a BJT. Accordingly, references herein to a "gate," "drain," and "source," are not intended to be limiting, as each of these designations has analogous features for a BJT implementation (e.g., a base, collector, and emitter, respectively). Power transistor 410 may be formed on a substrate selected from a silicon substrate, a gallium nitride substrate, a gallium arsenide substrate, and an indium gallium phosphide substrate.

Inter-stage network 402 connects the output of driver amplifier 404 to inputs of power transistors 408 and 410. The configuration of inter-stage network 402 depicted in FIG. 4 matches that of the schematic circuit shown in FIG. 3A.

Specifically, the output of driver amplifier 404 is connected to an input of power transistor 410 through capacitor 416 (capacitor 416 is analogous to capacitor 308 of FIG. 3A). The output of driver amplifier 404 is also connected to a first terminal of inductor 418 (inductor 418 is analogous to inductor 310 shown in FIG. 3A). The second terminal of inductor 418 is connected to capacitor 420 which is, in turn, connected to an input of power transistor 408 (capacitor 420 is analogous to capacitor 312 of FIG. 3A).

Accordingly, as depicted in FIG. 4, by implementing inter-stage network 402 in accordance with the schematic shown in FIG. 3A, in the integrated circuit implementation shown in FIG. 4, the area required to implement inter-stage network 402 can be substantially reduced over that of the conventional inter-stage network (see, for example, FIG. 2A).

Using conventional inter-stage networks, for example, a single driver amplifier is coupled to only a single final-stage amplifier, such as a power transistor. Such an implementation requires two separate ICs to implement a dual-stage amplifier, such as a Doherty amplifier. The present inter-stage network 402 enables both stages of a Doherty amplifier to be implemented within a single semiconductor die, potentially resulting in package ⅓ the size of the conventional approach.

Power amplifier 400, therefore, may combine functionality that is often implemented in separate components into a single integrated circuit. For example, power amplifier 400 includes two separate amplifier stages in power transistor 408 and 410, which could, for example, replace the two separate stages 30 and 50 in the conventional multi-stage amplifier depicted in FIG. 1.

Additionally, inter-stage network 402 provides the functionality of a power splitter, in that by adjusting the capacitance values of capacitors 416 and 420, the magnitude of RF signal being input into each of power transistors 408 and 410 can be adjusted. Accordingly, power amplifier 400 also contains the power splitter functionality that may ordinarily be implemented in another separate component, such as power splitter 70 of FIG. 1. For example, to implement such an adjustable distribution of signal into each of power transistors 408 and 410 an adjustable resistor (analogous to resistor 314 of FIG. 3B) may be coupled, for example via wire bond, to output pad 412 of power transistor 408.

Figure 5:
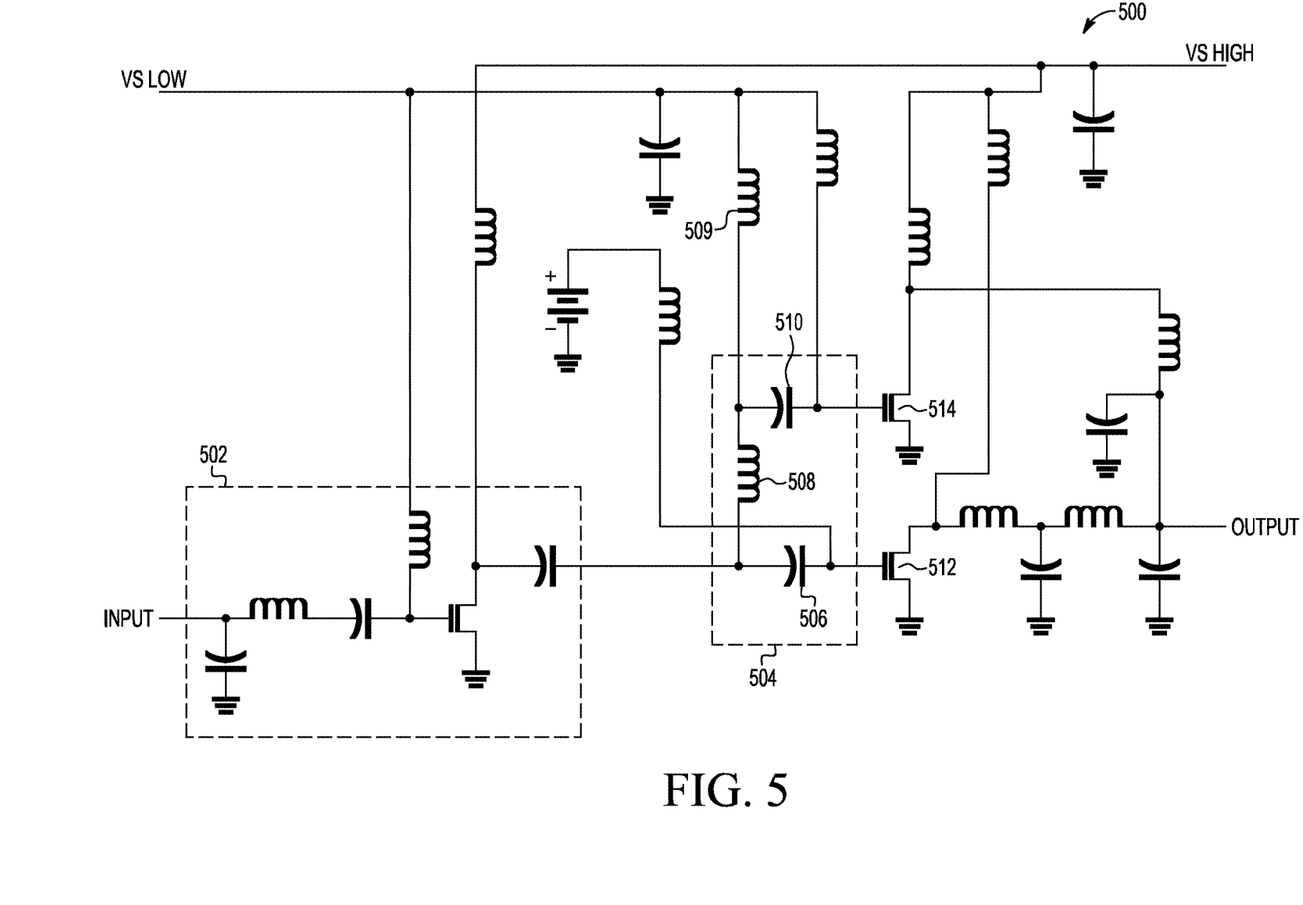
FIG. 5 is a schematic depicting an implementation of a 2 stage amplifier module which incorporates a single driver with the present inter-stage network providing tunable input powers to a final Doherty amplifier stage.

FIG. 5 is a schematic depicting an implementation of a dual-stage amplifier incorporate the present inter-stage network. Circuit 500 shows a driver amplifier 502 which is connected to inter-stage network 504. Inter-stage network 504 includes a first capacitor 506, which may be analogous within the inter-stage network to capacitor 308 of FIG. 3A. Capacitor 506 is connected to inductor 508, which may be analogous within the inter-stage network to inductor 310 of FIG. 3A. Inter-stage network 504 includes a second capacitor 510, which may be analogous within the inter-stage network to capacitor 312 of FIG. 3A. A terminating inductance 509 is coupled to capacitor 510 and may provide similar functionality to the termination resistance 314 shown in FIG. 3B. In other embodiments, terminating inductance 509 may be replaced by a terminating resistance. Capacitor 506 is connected to transistor 512. Transistor 512 may include a power transistor and may be analogous to transistor 304 shown in FIG. 3A. Similarly, capacitor 510 is connected to transistor 514. Transistor 514 may include a power transistor and may be analogous to transistor 306 shown in FIG. 3A.

Figure 6:
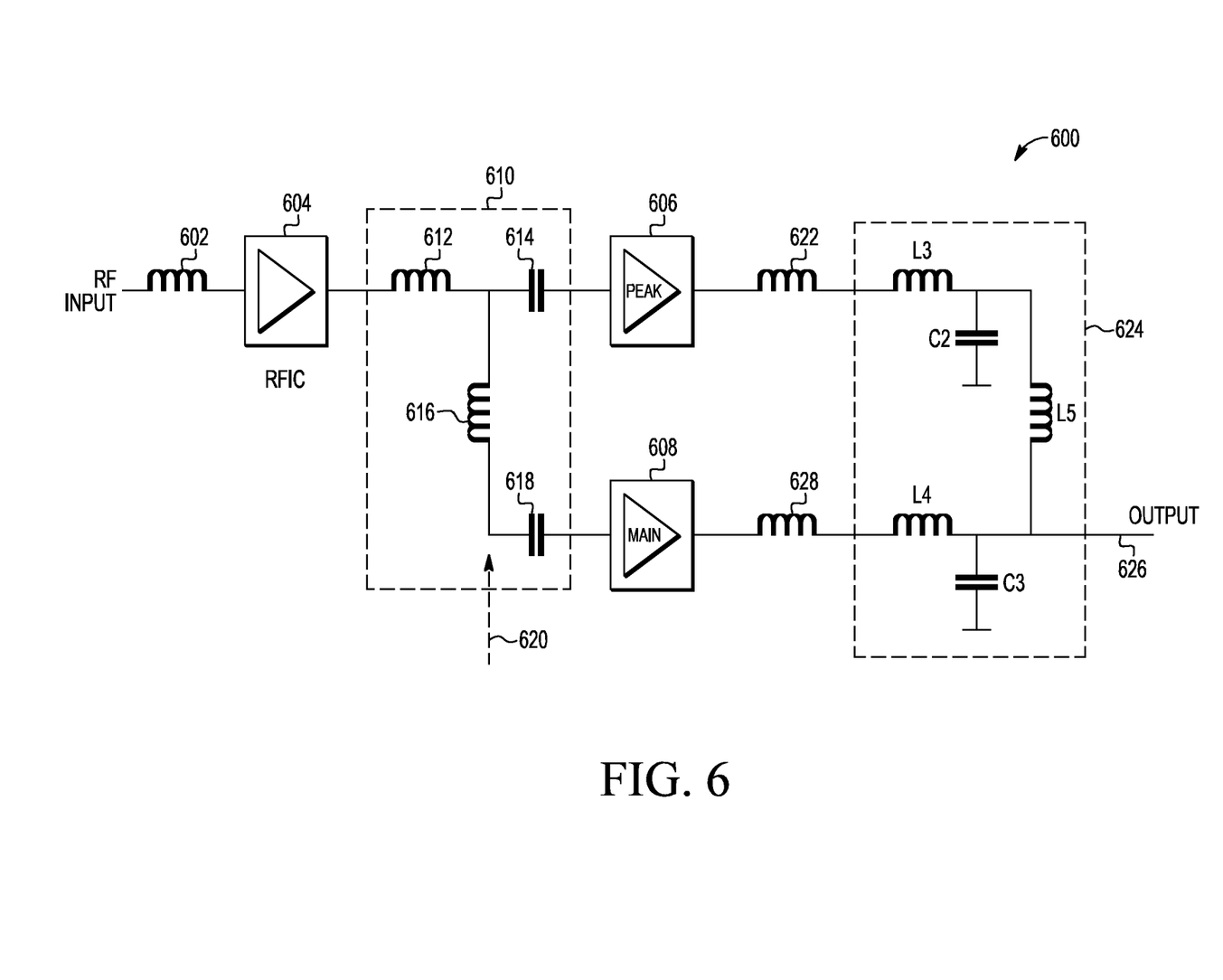
FIG. 6 depicts an amplifier implemented in an inverted Doherty configuration and incorporating the present inter-stage network.

FIG. 6 depicts an amplifier 600 implemented in an inverted Doherty configuration. Amplifier 600 includes a single driver stage coupled through the present inter-stage network to an output.

Amplifier 600 includes input terminal 602 coupled to driver amplifier 604. Driver amplifier 604 is coupled to peaking amplifier 606 and main amplifier 608 through inter-stage network 610. Inter-stage network 610 includes inductor 612 coupled to capacitor 614 and inductor 616. Inductor 616 is coupled to main amplifier 608 through capacitor 618. An adjustable resistor (represented by arrow 620) can be coupled to inter-stage network 610 between inductor 616 and capacitor 618. As described above, by selecting an appropriate resistance value for the adjustable resistor, the relative magnitudes of the signals passed through inter-stage network 610 into each of peaking amplifier 606 and main amplifier 608 can be adjusted.

The output of peaking amplifier 606 is passed through transmission line 622 to output terminal 626 through output combiner 624. Similarly, the output of main amplifier 608 is passed through transmission line 628 to output terminal 626 through output combiner 624.

For the sake of brevity, conventional techniques related to Doherty amplifiers, load modulation, impedance matching, integrated circuit design and/or fabrication, transistor design and/or fabrication, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "substantial" and "substantially" herein mean sufficient to accomplish the stated purpose in a practical manner and that minor imperfections, if any, are not significant for the stated purpose.

In conclusion, systems, devices, and methods configured in accordance with example embodiments of the invention relate to:

A device including a driver amplifier having a driver output terminal and a main amplifier configured to amplify a main input signal. The main amplifier has a main input terminal. The device includes a peaking amplifier configured to amplify a peaking input signal. The peaking amplifier has a peaking input terminal. The device includes an inter-stage network connected between the driver amplifier and the main amplifier and between the driver amplifier and the peaking amplifier. The inter-stage network includes a first capacitor having a first terminal and a second terminal. The first terminal of the first capacitor is connected directly to the driver output terminal and the second terminal of the first capacitor being connected directly to the main input terminal to supply the main input signal. The inter-stage network includes an inductor having a first terminal and a second terminal. The first terminal of the inductor is connected directly to the first terminal of the first capacitor. The inter-stage network includes a second capacitor having a first terminal and a second terminal. The first terminal of the second capacitor is connected directly to the second terminal of the inductor and the second terminal of the second capacitor is connected directly to the peaking input terminal to supply the peaking input signal.

A packaged device includes a substrate, a package input terminal configured to receive a radio frequency input signal, and a driver amplifier mounted to the substrate and configured to receive the radio frequency input signal. The packaged device includes a first amplifier mounted to the substrate. The first amplifier includes a first amplifier input terminal. The package device includes a second amplifier mounted to the substrate. The second amplifier includes a second amplifier input terminal. The packaged device includes an inter-stage network connected between the driver amplifier and the first amplifier and between the driver amplifier and the second amplifier. The inter-stage network includes a first capacitor connected between the driver amplifier and the first amplifier input terminal, an inductor having a first terminal and a second terminal, the first terminal of the inductor being connected to the first capacitor, and a second capacitor connected between the second terminal of the inductor and the second amplifier input terminal.

A device includes a first capacitor having a first terminal and a second terminal. The first terminal of the first capacitor is connected directly to a driver output terminal of a driver amplifier and the second terminal of the first capacitor is connected directly to a main input terminal to supply a main input signal to a main amplifier configured to amplify the main input signal. The device includes an inductor having a first terminal and a second terminal. The first terminal of the inductor is connected directly to the first terminal of the first capacitor. The device includes a second capacitor having a first terminal and a second terminal. The first terminal of the second capacitor is connected directly to the second terminal of the inductor and the second terminal of the second capacitor is connected directly to a peaking input terminal to supply a peaking input signal to a peaking amplifier configured to amplify the peaking input signal.

The foregoing description was primarily directed to preferred embodiments of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

The invention claimed is:

1. A device, comprising:
a driver amplifier having a driver output terminal;
a main amplifier configured to amplify a main input signal, the main amplifier having a main input terminal;
a peaking amplifier configured to amplify a peaking input signal, the peaking amplifier having a peaking input terminal;
an inter-stage network connected between the driver amplifier and the main amplifier and between the driver amplifier and the peaking amplifier, the inter-stage network including:
a first capacitor having a first terminal and a second terminal, the first terminal of the first capacitor being connected directly to the driver output terminal and the second terminal of the first capacitor being connected directly to the main input terminal to supply the main input signal,
an inductor having a first terminal and a second terminal, the first terminal of the inductor being connected directly to the first terminal of the first capacitor, and
a second capacitor having a first terminal and a second terminal, the first terminal of the second capacitor being connected directly to the second terminal of the inductor and the second terminal of the second capacitor being connected directly to the peaking input terminal to supply the peaking input signal; and
a resistor having a first terminal and a second terminal, wherein the first terminal of the resistor is connected directly to the first terminal of the second capacitor and the second terminal of the resistor is connected to a ground node.

2. The device of claim 1, wherein the resistor is a variable resistor and changes to a resistance of the variable resistance modify a magnitude of the main input signal and a magnitude of the peaking input signal.

3. The device of claim 1, wherein an output terminal of the main amplifier and an output terminal of the peaking amplifier are connected to an output power combiner.

4. The device of claim 1, wherein the inductor is a transmission line configured to introduce a 90 degree phase shift in a signal passing through the transmission line.

5. The device of claim 4, wherein the transmission line is a coplanar waveguide transmission line.

6. The device of claim 1, wherein at least one of the driver amplifier and the peaking amplifier includes a transistor formed on a substrate selected from a silicon substrate, a gallium nitride substrate, a gallium arsenide substrate, and an indium gallium phosphide substrate.

7. A packaged device, comprising:
a substrate;
a package input terminal configured to receive a radio frequency input signal;
a driver amplifier mounted to the substrate and configured to receive the radio frequency input signal;
a first amplifier mounted to the substrate, the first amplifier including a first amplifier input terminal;
a second amplifier mounted to the substrate, the second amplifier including a second amplifier input terminal;
an inter-stage network connected between the driver amplifier and the first amplifier and between the driver amplifier and the second amplifier, the inter-stage network including:

a first capacitor connected between the driver amplifier and the first amplifier input terminal, an inductor having a first terminal and a second terminal, the first terminal of the inductor being connected to the first capacitor, and a second capacitor connected between the second terminal of the inductor and the second amplifier input terminal; and a variable resistor connected between the second capacitor and a ground node, wherein changes to a resistance of the variable resistor modify a magnitude of an input signal to the first amplifier and a magnitude of a second input signal to the second amplifier.

8. The packaged device of claim 7, wherein a capacitance of the first capacitor is determined by a ratio of an output radio frequency voltage magnitude of the first amplifier and a radio frequency input drive voltage of the first amplifier.

9. The packaged device of claim 7, wherein an output terminal of the first amplifier and an output terminal of the second amplifier are connected to an output power combiner.

10. The packaged device of claim 7, wherein the inductor is a transmission line configured to introduce a 90 degree phase shift in a signal passing through the transmission line.

* * * * *